(12) United States Patent
Kim et al.

(10) Patent No.: US 12,471,486 B2
(45) Date of Patent: Nov. 11, 2025

(54) METHOD OF MANUFACTURING COVER WINDOW AND METHOD OF MANUFACTURING DISPLAY APPARATUS INCLUDING COVER WINDOW

(71) Applicant: SAMSUNG DISPLAY CO., LTD., Yongin-si (KR)

(72) Inventors: Byeongbeom Kim, Yongin-si (KR); Seung Kim, Yongin-si (KR); Seungho Kim, Yongin-si (KR); Cheolmin Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 463 days.

(21) Appl. No.: 17/944,467

(22) Filed: Sep. 14, 2022

(65) Prior Publication Data

US 2023/0225150 A1    Jul. 13, 2023

(30) Foreign Application Priority Data

Jan. 13, 2022  (KR) ........................ 10-2022-0005331

(51) Int. Cl.
*H10K 50/84* (2023.01)
*H10K 59/12* (2023.01)
*H10K 71/00* (2023.01)
*H10K 71/20* (2023.01)

(52) U.S. Cl.
CPC .......... *H10K 50/841* (2023.02); *H10K 59/12* (2023.02); *H10K 71/00* (2023.02); *H10K 71/231* (2023.02)

(58) Field of Classification Search
CPC ...... H10K 50/841; H10K 59/12; H10K 71/00; H10K 71/231; H10K 59/871; H10K 71/851; H10K 2102/311; C03C 23/0075; C03C 15/00; G09F 9/301; B08B 3/08; B08B 11/04; C09K 13/02; C09K 13/08
See application file for complete search history.

(56) References Cited

U.S. PATENT DOCUMENTS

| | | |
|---|---|---|
| 6,913,702 B2 | 7/2005 | Kurachi et al. |
| 10,730,793 B2 | 8/2020 | Kashima et al. |
| 11,114,523 B2 | 9/2021 | Park et al. |
| 12,103,885 B2 | 10/2024 | Alderman et al. |
| 2021/0070650 A1* | 3/2021 | Da .................. C03C 3/097 |
| 2023/0140373 A1* | 5/2023 | Park ................ C03C 17/32 |
| | | 428/121 |

FOREIGN PATENT DOCUMENTS

| | | |
|---|---|---|
| JP | 2002160943 A | 6/2002 |
| JP | 6809230 B2 | 1/2021 |
| KR | 1020110012241 A | 2/2011 |
| KR | 1020150087224 A | 7/2015 |
| KR | 1020160037952 A | 4/2016 |
| KR | 1020190018114 A | 2/2019 |
| KR | 1020200066471 A | 6/2020 |
| KR | 1020210013709 A | 2/2021 |
| KR | 20210046026 A | 4/2021 |

* cited by examiner

*Primary Examiner* — J. E. Schoenholtz
(74) *Attorney, Agent, or Firm* — CANTOR COLBURN LLP (57) ABSTRACT

A method of manufacturing a cover window includes: cutting mother glass into panel glass; chamfering the panel glass; etching an entire surface of the panel glass with a first etching solution including a fluorine-based compound; etching the entire surface of the panel glass with a second etching solution different from the first etching solution; and cleaning the panel glass with a basic cleaning solution.

22 Claims, 8 Drawing Sheets

METHOD OF MANUFACTURING COVER WINDOW AND METHOD OF MANUFACTURING DISPLAY APPARATUS INCLUDING COVER WINDOW

This application claims priority to Korean Patent Application No. 10-2022-0005331, filed on Jan. 13, 2022, and all the benefits accruing therefrom under 35 U.S.C. § 119, the content of which in its entirety is herein incorporated by reference.

BACKGROUND

1. Field

One or more embodiments relate to a method of manufacturing a cover window and a method of manufacturing a display apparatus including a cover window, and more particularly, to a method of manufacturing a cover window having improved strength and a method of manufacturing a display apparatus including the cover window.

2. Description of the Related Art

A cover window protects a display element in a display apparatus from external shock, and a user provides an input to the display apparatus through the cover window. In the case of a flexible display, weight reduction and thickness reduction of the cover window are desirable, and there is a problem in that strength of the cover window is degraded according to weight reduction and thickness reduction of the cover window. To solve this problem, micro-defects on a surface of the cover window are removed by etching the surface of the cover window with a solution including a fluorine-based compound.

SUMMARY

However, a method of manufacturing a cover window and a method of manufacturing a display apparatus including a cover window, according to the related art had a problem in that, when a surface of a cover window is etched with a solution including a fluorine-based compound, insoluble fluoride is generated on a surface of glass, and thus, the surface of glass under the insoluble fluoride is not etched.

To solve various problems including the above problem, one or more embodiments provide a method of manufacturing a cover window having improved strength and a method of manufacturing a display apparatus including the cover window. However, such a technical problem is an example, and the invention is not limited thereto.

Additional aspects will be set forth in part in the description which follows and, in part, will be apparent from the description, or may be learned by practice of the presented embodiments of the disclosure.

According to one or more embodiments, a method of manufacturing a cover window includes: cutting mother glass into panel glass; chamfering the panel glass; etching an entire surface of the panel glass with a first etching solution including a fluorine-based compound; etching the entire surface of the panel glass with a second etching solution different from the first etching solution; and cleaning the panel glass with a basic cleaning solution.

The first etching solution may be an acidic solution, and the second etching solution may be a basic solution.

The first etching solution may include at least one of hydrofluoric acid (HF), ammonium fluoride ($NH_4F$), and ammonium bifluoride ($NH_4HF_2$).

The second etching solution may have a pH of about 12 or greater.

The second etching solution may include at least one of sodium hydroxide (NaOH) and potassium hydroxide (KOH).

The etching with the second etching solution may be performed after the etching with the first etching solution.

The etching with the first etching solution may include etching the entire surface of the panel glass by immersing the panel glass in the first etching solution, and the etching with the second etching solution may include etching the entire surface of the panel glass by immersing the panel glass in the second etching solution.

A ratio between a reduced size of a thickness of the panel glass by the etching with the first etching solution and a reduced size of a thickness of the panel glass by the etching with the second etching solution may be 4:1 to 9:1.

The method may further include: cleaning the panel glass with an acidic cleaning solution, where the cleaning with the acidic cleaning solution may be performed between the etching with the second etching solution and the cleaning with the basic cleaning solution.

The acidic cleaning solution may have a pH of about 2 or less and may include no fluorine.

The basic cleaning solution may have a pH of about 12 or greater and may include at least one of sodium hydroxide (NaOH) and potassium hydroxide (KOH).

The second etching solution may have a pH of about 12 or greater and may include at least one of sodium hydroxide (NaOH) and potassium hydroxide (KOH), where a temperature of the basic cleaning solution in the cleaning with the basic cleaning solution may be lower than a temperature of the second etching solution in the etching with the second etching solution.

According to one or more embodiments, a method of manufacturing a display apparatus includes: forming a thin-film transistor on a substrate; forming a display element above the thin-film transistor, wherein the display element is electrically connected to the thin-film transistor; manufacturing a cover window; and disposing the cover window over the display element. The manufacturing of the cover window includes: cutting mother glass into panel glass; chamfering the panel glass; etching an entire surface of the panel glass with a first etching solution including a fluorine-based compound; etching the entire surface of the panel glass with a second etching solution different from the first etching solution; and cleaning the panel glass with a basic cleaning solution.

The first etching solution may be an acidic solution, and the second etching solution may be a basic solution.

The first etching solution may include at least one of hydrofluoric acid (HF), ammonium fluoride ($NH_4F$), and ammonium bifluoride ($NH_4HF_2$).

The second etching solution may have a pH of about 12 or greater.

The second etching solution may include at least one of sodium hydroxide (NaOH) and potassium hydroxide (KOH).

The etching with the second etching solution may be performed after the etching with the first etching solution.

The etching with the first etching solution may include etching the entire surface of the panel glass by immersing the panel glass in the first etching solution, and the etching with the second etching solution may include etching the entire surface of the panel glass by immersing the panel glass in the second etching solution.

A ratio between a reduced size of a thickness of the panel glass by the etching with the first etching solution and a reduced size of a thickness of the panel glass by the etching with the second etching solution may be 4:1 to 9:1.

The manufacturing of the cover window may further include: cleaning the panel glass with an acidic cleaning solution, where the cleaning with the acidic cleaning solution may be performed between the etching with the second etching solution and the cleaning with the basic cleaning solution.

The acidic cleaning solution may have a pH of about 2 or less and may include no fluorine.

The basic cleaning solution may have a pH of about 12 or greater and may include at least one of sodium hydroxide (NaOH) and potassium hydroxide (KOH).

The second etching solution may have a pH of about 12 or greater and may include at least one of sodium hydroxide (NaOH) and potassium hydroxide (KOH), wherein a temperature of the basic cleaning solution in the cleaning with the basic cleaning solution may be lower than a temperature of the second etching solution in the etching with the second etching solution.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the present embodiments may have different forms and should not be construed as being limited to the descriptions set forth herein.

One or more embodiments will be described below in more detail with reference to the accompanying drawings. Those elements that are the same or are in correspondence with each other are rendered the same reference numeral regardless of the figure number, and redundant descriptions thereof are omitted.

It will be understood that, when an element such as a layer, a film, a region, or a plate is referred to as being "on" another element, it may be directly on the other element, or intervening elements may be present therebetween. In addition, sizes of elements in the drawings may be exaggerated or reduced for convenience of explanation. For example, since sizes and thicknesses of elements in the drawings are arbitrarily illustrated for convenience of explanation, the following embodiments are not limited thereto.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

While such terms as "first" and "second" may be used to describe various elements, such elements must not be limited to the above terms. The above terms are used only to distinguish one element from another.

The singular forms "a," "an," and "the" as used herein are intended to include the plural forms as well unless the context clearly indicates otherwise.

It will be further understood that the terms "include," "comprise," and "have" as used herein specify the presence of stated features or elements but do not preclude the addition of one or more other features or elements.

As used herein, the expression "A and/or B" refers to A, B, or A and B. In addition, the expression "at least one of A and B" refers to A, B, or A and B.**

Figure 1:
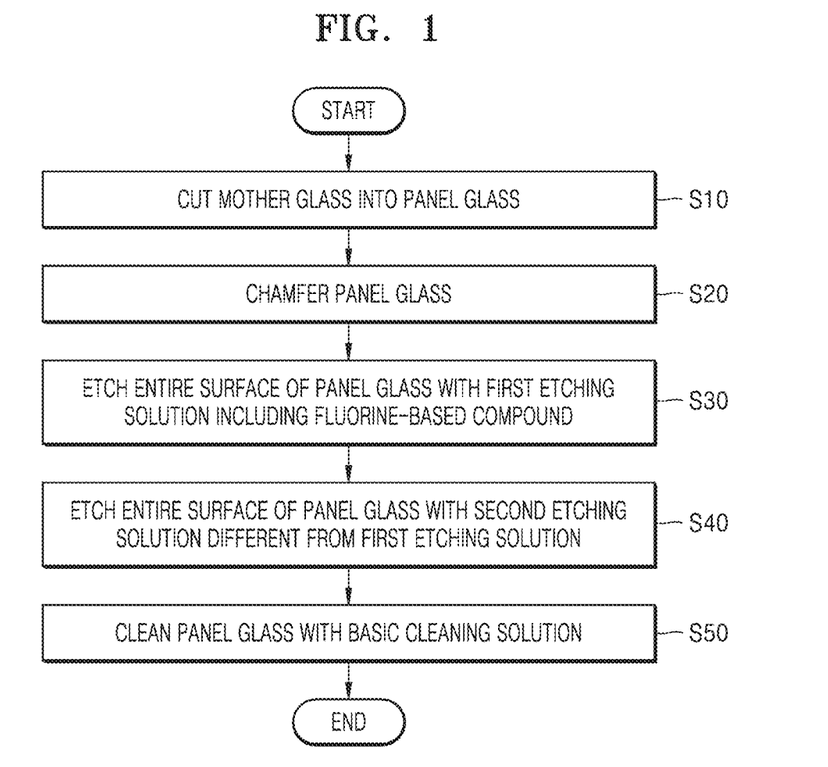
FIG. 1 is a flowchart of a method of manufacturing a cover window, according to an embodiment.

FIG. 1 is a flowchart of a method of manufacturing a cover window, according to an embodiment. As shown in FIG. 1, a method of manufacturing a cover window, according to an embodiment includes an operation of cutting mother glass into panel glass (in operation S10), an operation of chamfering the panel glass (in operation S20), an operation of etching the panel glass with a first etching solution (in operation S30), an operation of etching the panel glass with a second etching solution (in operation S40), and an operation of cleaning the panel glass with a basic cleaning solution (in operation S50).

During the operation of cutting mother glass into panel glass (in operation S10), a plurality of sheets of mother glass may be stacked and then the stacked sheets of mother glass may be cut at a preset size at a time, and thus, mother glass may be cut in a form in which a plurality of sheets of panel glass are stacked. For example, stacked sheets of mother glass may be cut simultaneously by using a wheel, a laser, a water-jet, or etching, and thus, groups of stacked sheets of panel glass may be obtained.

The mother glass may be ultra thin glass ("UTG"). Specifically, the mother glass may have a thickness of 30 micrometers (μm) to 50 μm. Glass may have more flexibility as a thickness thereof decreases but at the same time, strength of glass may be degraded. Accordingly, when a thickness of mother glass is less than 30 μm, strength of mother glass may decrease excessively. When a thickness of mother glass is greater than 50 μm, mother glass may have no flexibility or may not have sufficient flexibility. The mother glass may include soda-lime glass, alkali aluminosilicate glass, borosilicate glass, or lithium aluminosilicate glass.

During the operation of chamfering the panel glass (in operation S20), corners of side surfaces of the plurality of stacked sheets of panel glass may be chamfered simultaneously. The panel glass may be chamfered through a computerized numerical control ("CNC") process.

During the operation of etching the panel glass with a first etching solution (in operation S30), an entire surface of the panel glass may be etched with a first etching solution including a fluorine-based compound. Specifically, an entire surface of the panel glass may be etched by immersing the panel glass in the first etching solution. That is, a first etching bath may be filled with the first etching solution, and for example, the panel glass may be immersed in this first etching bath for about 1 to 2 minutes. Afterwards, the panel glass may be removed from the first etching bath.

The first etching solution may be an acidic solution. The acidic solution refers to a solution which has a hydrogen ion concentration exponent (hereinafter, "pH") less than 7. In contrast, a basic solution (i.e., alkaline solution) refers to a solution which has a pH greater than 7. The first etching solution may include a fluorine-based compound. The fluorine-based compound may chemically react with at least some of the materials constituting the panel glass to melt the panel glass. Accordingly, by etching an entire surface of the panel glass with the first etching solution including a fluorine-based compound, a surface of the panel glass may be uniformly melted to remove micro-defects on the surface of the panel glass.

The fluorine-based compound included in the first etching solution may be a compound in which fluorine ions or polyatomic fluorine ions are dissociated. For example, the fluorine-based compound may include at least one of hydrofluoric acid (HF), ammonium fluoride ($NH_4F$), sodium fluoride (NaF), potassium fluoride (KF), ammonium bifluoride ($NH_4HF_2$), sodium bifluoride ($NaHF_2$), and potassium bifluoride ($KHF_2$), but the invention is not limited thereto. The fluorine-based compound is a main component of the first etching solution, and the first etching solution may further include an inorganic acid or an organic acid.

The fluorine-based compound may improve an etching rate of the panel glass. Specifically, the fluorine-based compound melts a surface of the panel glass within a short time, and accordingly, micro-defects on the surface of the panel glass may be removed with the first etching solution within a short time. However, the fluorine-based compound may chemically react with metal ions on the surface of the panel glass to form insoluble fluoride. Such insoluble fluoride is on the surface of the panel glass, and thus, a portion of the panel glass under the insoluble fluoride may not be etched by the first etching solution. As a result, roughness of the surface of the panel glass may increase, and micro-defects of the surface of the panel glass may not be completely removed.

During the operation of etching the panel glass with a second etching solution (in operation S40), the entire surface of the panel glass may be etched with a second etching solution different from the first etching solution. Specifically, the entire surface of the panel glass may be etched by immersing the panel glass in the second etching solution. That is, a second etching bath different from the first etching bath may be filled with the second etching solution, and a temperature of the second etching bath may be maintained at about 70 degrees in Celsius (° C.) to about 90° C., for example. The panel glass may be immersed in the second etching bath for about 30 minutes and then may be removed from the second etching bath.

The second etching solution may be a basic solution (i.e., alkaline solution). Specifically, the pH of the second etching solution may be 12 or greater. The basic solution may chemically react with at least some of the materials constituting the panel glass to melt the panel glass. Accordingly, although insoluble fluoride formed by the chemical reaction between the first etching solution and the metal ions of the panel glass is on the surface of the panel glass, such insoluble fluoride may be effectively removed by the second etching solution. The second etching solution may include at least one of sodium hydroxide (NaOH) and potassium hydroxide (KOH), but the invention is not limited thereto.

A temperature of the second etching solution may be maintained at 70° C. to 90° C. When a temperature of the second etching solution is less than 70° C., an etching rate by the second etching solution is excessively low, and thus, the panel glass may not be sufficiently etched within a certain time. However, in a method of manufacturing a cover window, according to the present embodiment, a temperature of the second etching solution is 70° C. to 90° C., and accordingly, the panel glass may be sufficiently etched within a short time even by the basic solution.

The second etching solution may not include a fluorine-based compound. Accordingly, the second etching solution may not form insoluble fluoride. In addition, the second etching solution may chemically react with at least some of the materials constituting the panel glass to melt the panel glass. At the same time, insoluble fluoride formed by the chemical reaction between the fluorine-based compound and the metal ions may also be effectively removed. As a result, roughness of the surface of the panel glass decreases, and micro-defects of the surface of the panel glass may be completely removed or such micro-defects may be removed as many as possible. A detailed description of the effect generated by etching the panel glass with the second etching solution will be given below.

The second etching solution, which is a basic solution, may melt a surface of the panel glass but may have a low etching rate compared to the first etching solution including a fluorine-based compound. Accordingly, by etching the panel glass more with the first etching solution having a high etching rate and then etching the panel glass with the second etching solution, insoluble fluoride formed by the chemical reaction between the first etching solution and metal ions of the panel glass may be effectively removed. Thus, the total time to etch the panel glass may be reduced.

A thickness of the panel glass reduced by etching with the first etching solution and a thickness of the panel glass reduced by etching with the second etching solution may be different from each other. That is, a ratio between a reduced size of a thickness of the panel glass by etching with the first etching solution (i.e., a part of a thickness of the panel glass removed by the etching with the first etching solution) and a reduced size of a thickness of the panel glass by etching with the second etching solution (i.e., a part of a thickness of the panel glass removed by the etching with the second etching solution) may be 4:1 to 9:1. When a ratio between a reduced size of a thickness of the panel glass by etching with the first etching solution and a reduced size of a thickness of the panel glass by etching with the second etching solution is less than 4:1, a time period for etching the panel glass with the first etching solution is reduced compared to a case where the corresponding ratio is 4:1 or greater, and thus, the total time to etch the panel glass to decrease a thickness of the panel glass (i.e., sum of the time period for etching the panel glass with the first etching solution and the time period for etching the panel glass with the second etching solution) may increase. When a ratio between a reduced size of a thickness of the panel glass by etching with the first etching solution and a reduced size of a thickness of the panel glass by etching with the second etching solution is greater than 9:1, a time period for etching the panel glass with the second etching solution is reduced compared to a case where the corresponding ratio is 9:1 or less, and thus, insoluble fluoride formed by the chemical reaction between the first etching solution and metal ions of the panel glass may not be sufficiently removed.

During the operation of cleaning the panel glass with a basic cleaning solution (in operation S50), the entire surface of the panel glass may be cleaned with a basic cleaning solution. Specifically, the entire surface of the panel glass may be cleaned by immersing the panel glass in the basic cleaning solution. That is, a basic cleaning bath may be filled with the basic cleaning solution, and the panel glass may be immersed in the basic cleaning solution for about 5 minutes, for example. Afterwards, the panel glass may be removed from the basic cleaning bath.

The basic cleaning solution may be a basic solution (i.e., alkaline solution). Specifically, the basic cleaning solution may have a pH of 12 or greater. For example, the basic cleaning solution may include at least one of sodium hydroxide (NaOH) and potassium hydroxide (KOH). However, the invention is not limited thereto, and a basic solution having a pH of 12 or greater may be used as the basic cleaning solution.

A temperature of the basic cleaning solution when cleaning the panel glass with the basic cleaning solution may be lower than a temperature of the second etching solution when etching the panel glass with the second etching solution. Specifically, a temperature of the second etching solution when etching the panel glass with the second etching solution may be 70° C. to 90° C., and a temperature of the basic cleaning solution when cleaning the panel glass with the basic cleaning solution may be 40° C. or less. As described above, a temperature of the basic cleaning solution is less than 70° C., and accordingly, the surface of the panel glass may hardly be melted by the basic cleaning solution. However, foreign materials on the surface of the panel glass may be removed by cleaning the panel glass with the basic cleaning solution.

Figure 2:
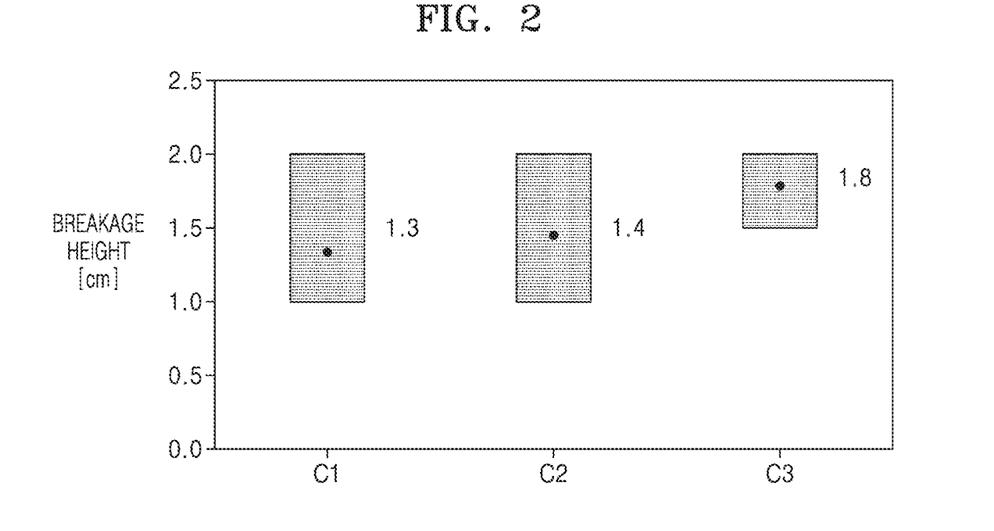
FIG. 2 is a graph showing strengths of cover windows manufactured by a manufacturing method according to an embodiment.

FIG. 2 is a graph showing strengths of cover windows manufactured by a manufacturing method according to an embodiment. In FIG. 2, for convenience of description, results of evaluating strengths of a first cover window C1 manufactured by a manufacturing method according to a comparative example and a second cover window C2 and a third cover window C3 manufactured by a manufacturing method according to an embodiment are each shown. Specifically, FIG. 2 shows the results of a drop test to evaluate impact resistance. The drop test was performed by making the same ball-point pen vertically free-fall from above the first cover window C1, the second cover window C2, and the third cover window C3 and measuring minimum heights at which the first cover window C1, the second cover window C2, and the third cover window C3 were broken by the ball-point pen.

The first cover window C1 may be a cover window which has not gone through the operation of etching with a second etching solution (in operation S40) from among operations of the manufacturing method according to an embodiment. The second cover window C2 and the third cover window C3 are manufactured by the manufacturing method according to an embodiment and thus may be cover windows which have gone through the operation of etching with a second etching solution (in operation S40). Specifically, in the second cover window C2, a ratio between a reduced size of a thickness of panel glass by etching with a first etching solution (i.e., a part of a thickness of the panel glass removed by the etching with the first etching solution) and a reduced size of a thickness of panel glass by etching with a second etching solution (i.e., a part of a thickness of the panel glass removed by the etching with the second etching solution) may be 9:1. In the third cover window C3, a ratio between a reduced size of a thickness of panel glass by etching with the first etching solution (i.e., a part of a thickness of the panel glass removed by the etching with the first etching solution) and a reduced size of a thickness of panel glass by etching with the second etching solution (i.e., a part of a thickness of the panel glass removed by the etching with the second etching solution) may be 4:1. That is, the panel glass of the third cover window C3 may be more etched with the second etching solution than the panel glass of the second cover window C2.

As shown in FIG. 2, the first cover window C1 has a result value distributed in a range of 1.0 centimeters (cm) to 2.0 cm and may have impact resistance with respect to the ball-point pen dropped at a height of average 1.3 cm. The second cover window C2 also has a result value distributed in a range of 1.0 cm to 2.0 cm but may have impact resistance with respect to the ball-point pen dropped at a height of average 1.4 cm. The third cover window C3 has a result value distributed in a range of 1.5 cm to 2.0 cm and may have impact resistance with respect to the ball-point pen dropped at a height of average 1.8 cm. That is, the second cover window C2 and the third cover window C3 manufactured by the manufacturing method according to an embodiment may have improved impact resistance compared to the first cover window C1 manufactured by the manufacturing method according to a comparative example. That is, a method of manufacturing a cover window may further include the operation of etching with a second etching solution (in operation S40), thereby manufacturing a cover window having improved strength.

Figure 3:
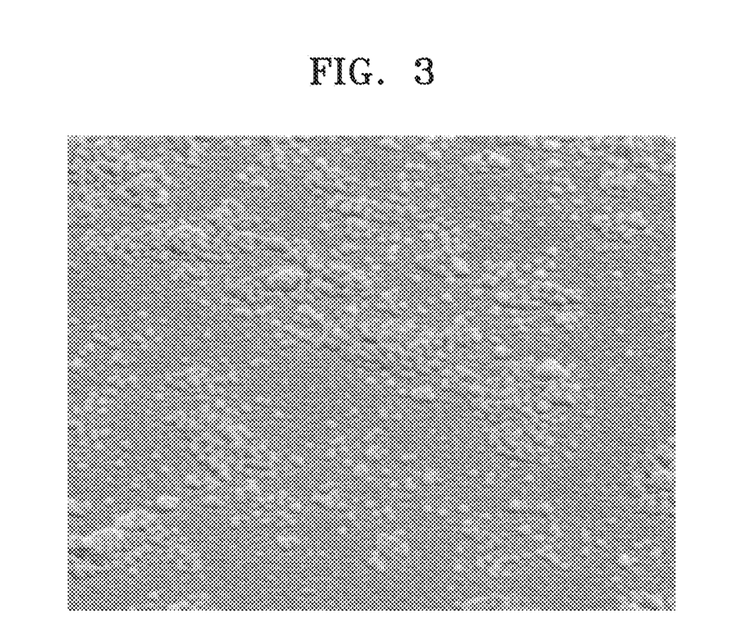
FIG. 3 is a photomicrograph of a surface of a cover window manufactured by a manufacturing method according to a comparative example.
Figure 4:
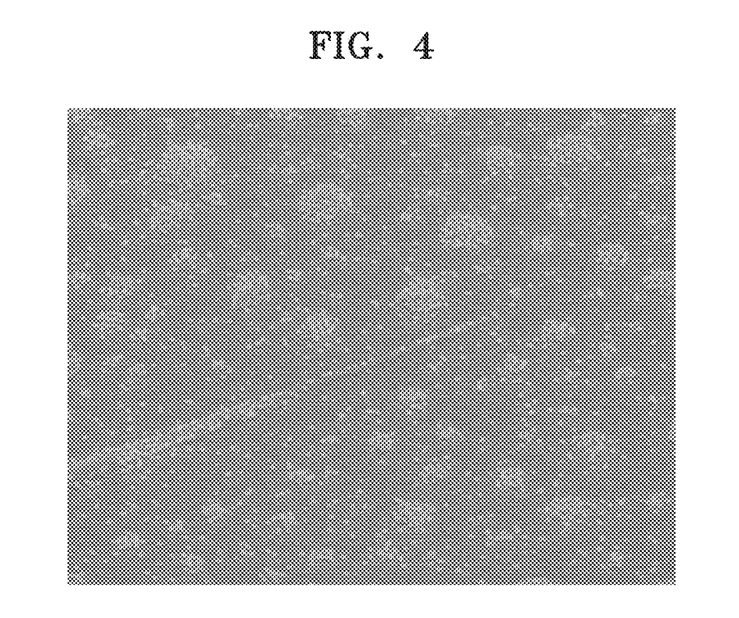
FIGS. 4 and 5 are photomicrographs of surfaces of cover windows manufactured by a manufacturing method according to an embodiment.
Figure 5:
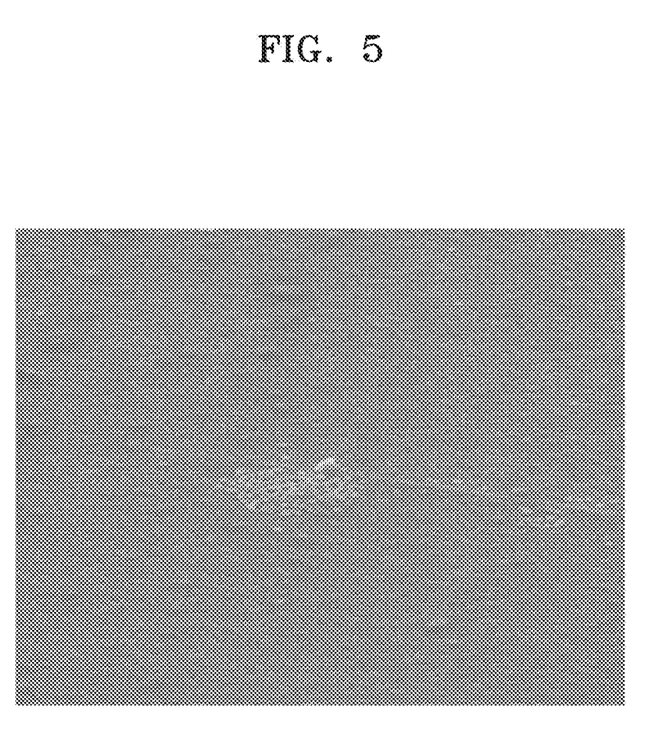

The strength of a surface of a cover window may be related to roughness of the cover window. Specifically, as the roughness of a surface of a cover window increases, cracks may be easily propagated by external shock, and thus, strength of the cover window may be low. FIG. 3 is a photomicrograph of a surface of a cover window manufactured by a manufacturing method according to a comparative example. FIGS. 4 and 5 are photomicrographs of surfaces of cover windows manufactured by a manufacturing method according to an embodiment. Specifically, FIG. 3 is a photomicrograph of a surface of the first cover window C1, FIG. 4 is a photomicrograph of a surface of the second cover window C2, and FIG. 5 is a photomicrograph of a surface of the third cover window C3.

As shown in FIGS. 3 and 4, roughness of the surface of the second cover window C2 may be less than roughness of the surface of the first cover window C1. This may be because, by the operation of etching with a second etching solution (in operation S40), insoluble fluoride on the surface of the second cover window C2 has been removed and micro-defects have been reduced. In addition, as shown in FIG. 5, roughness of the surface of the third cover window C3 may be less than roughness of the surface of the second cover window C2. This may be because, as described above, the panel glass of the third cover window C3 is more etched with the second etching solution than the panel glass of the second cover window C2, and thus, insoluble fluoride on the surface of the third cover window C3 has been removed more than insoluble fluoride on the surface of the second cover window C2 and micro-defects have been further reduced.

Accordingly, as shown in FIG. 2, the first cover window C1 having large roughness may have a low strength, and the third cover window C3 having small roughness may have a high strength.

Figure 6:
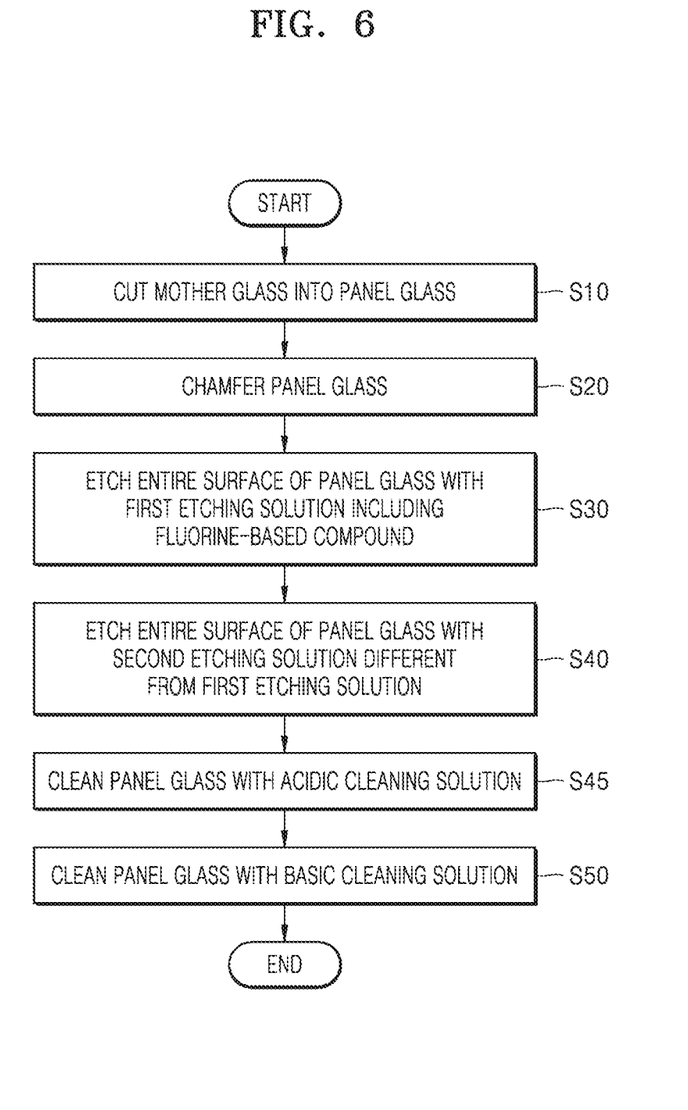
FIG. 6 is a flowchart of a method of manufacturing a cover window, according to another embodiment.

As shown in FIG. 6, which is a flowchart for describing a method of manufacturing a cover window, according to an embodiment, the method of manufacturing a cover window, according to an embodiment may further include an operation of cleaning the panel glass with an acidic cleaning solution (in operation S45) between the operation of etching the panel glass with a second etching solution (in operation S40) and the operation of cleaning the panel glass with a basic cleaning solution (in operation S50).

During the operation of cleaning the panel glass with an acidic cleaning solution (in operation S45), the entire surface of the panel glass may be cleaned with an acidic cleaning solution. Specifically, the entire surface of the panel glass may be cleaned by immersing the panel glass in the acidic cleaning solution. That is, an acidic cleaning bath may be filled with the acidic cleaning solution, and the panel glass may be immersed in the acidic cleaning solution for about 1 to 10 minutes. Afterwards, the panel glass may be removed from the acidic cleaning bath.

The acidic cleaning solution may be an acidic solution. Specifically, the acidic cleaning solution may have a pH of 2 or less. For example, the acidic cleaning solution may include at least one of nitric acid ($HNO_3$), sulfuric acid ($H_2SO_4$), and hydrochloric acid (HCl). However, the invention is not limited thereto, and an acidic solution having a pH of 2 or less may be used as the acidic cleaning solution. A temperature of the acidic cleaning solution when cleaning the panel glass with the acidic cleaning solution may be about 40° C. or less.

The acidic cleaning solution may not include a fluorine-based compound. Accordingly, the acidic cleaning solution may not form insoluble fluoride. The acidic cleaning solution removes some of the metal ions on the surface of the panel glass, and as a result, a portion from which the metal ions are removed may exist as an empty space. Accordingly, even when external shock is applied to the cover window, the shock may be alleviated by the empty space. That is, strength of the cover window may improve.

In addition, the acidic cleaning solution may chemically react with at least some of the materials constituting the panel glass to melt the panel glass. Thus, among insoluble fluorides formed by the chemical reaction between the fluorine-based compound and the metal ions, insoluble fluoride that is not removed by etching using the second etching solution may also be additionally removed. Accordingly, roughness of the surface of the panel glass is reduced compared to when not cleaned with the acidic cleaning solution, and micro-defects on the surface of the panel glass may be removed more than when not cleaned with the acidic cleaning solution.

Figure 7:
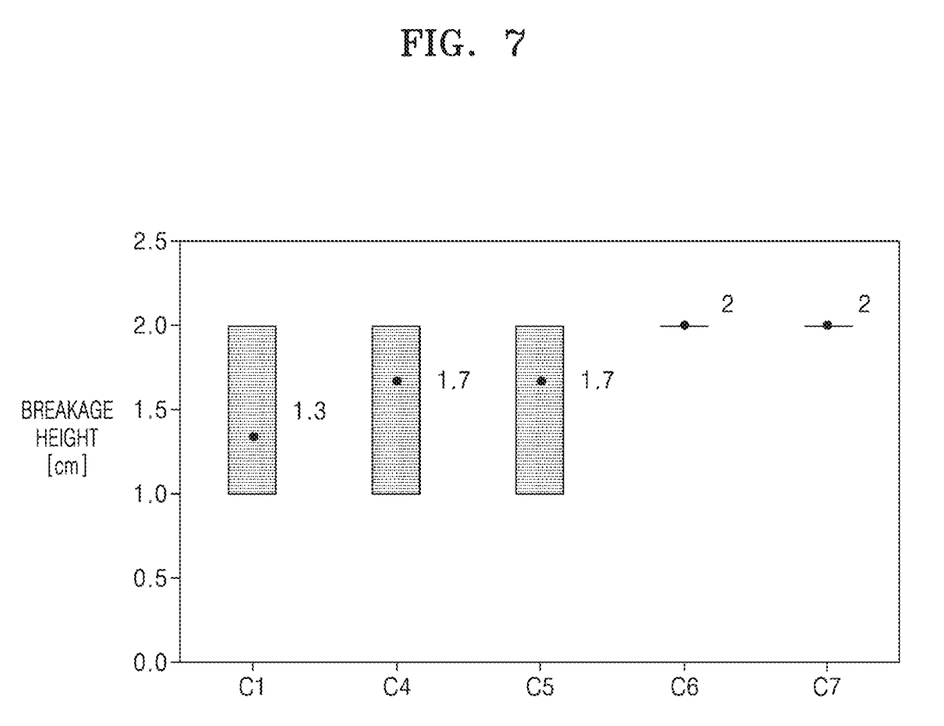
FIG. 7 is a graph showing strengths of cover windows manufactured by a manufacturing method according to an embodiment.

FIG. 7 is a graph showing strengths of cover windows manufactured by a manufacturing method according to an embodiment. In FIG. 7, for convenience of description, results of evaluating strengths of the first cover window C1 manufactured by a manufacturing method according to a comparative example and a fourth cover window C4, a fifth cover window C5, a sixth cover window C6, and a seventh cover window C7 manufactured by a manufacturing method according to an embodiment are each shown. Specifically, FIG. 7 shows the results of a drop test to evaluate impact resistance. The drop test was performed by making the same ball-point pen vertically free-fall from above the first cover window C1, the fourth cover window C4, the fifth cover window C5, the sixth cover window C6, and the seventh cover window C7 and measuring minimum heights at which the first cover window C1, the fourth cover window C4, the fifth cover window C5, the sixth cover window C6, and the seventh cover window C7 were broken by the ball-point pen.

The first cover window C1 may be a cover window which has not gone through the operation of etching with a second etching solution (in operation S40) and the operation of cleaning with an acidic cleaning solution (in operation S45) from among operations of the manufacturing method according to an embodiment. The fourth cover window C4, the fifth cover window C5, the sixth cover window C6, and the seventh cover window C7 may be cover windows which have not gone through the operation of etching with a second etching solution (in operation 40) and have gone through the operation of cleaning with an acidic cleaning solution (in operation S45). Specifically, the fourth cover window C4 may be a cover window cleaned with an acidic cleaning solution including nitric acid for 1 minute, and the fifth cover window C5 may be a cover window cleaned with an acidic cleaning solution including nitric acid for 3 minutes. The sixth cover window C6 may be a cover window cleaned with an acidic cleaning solution including nitric acid for 5 minutes, and the seventh cover window C7 may be a cover window cleaned with an acidic cleaning solution including nitric acid for 10 minutes.

As shown in FIG. 7, the first cover window C1 has a result value distributed in a range of 1.0 cm to 2.0 cm and may have impact resistance with respect to the ball-point pen dropped at a height of average 1.3 cm. The fourth cover window C4 and the fifth cover window C5 also have result values distributed in a range of 1.0 cm to 2.0 cm but may have impact resistance with respect to the ball-point pen dropped at a height of average 1.7 cm. The sixth cover window C6 and the seventh cover window C7 may have impact resistance with respect to the ball-point pen dropped at a height of 2.0 cm, and the deviation of result values is also small. That is, the fourth cover window C4, the fifth cover window C5, the sixth cover window C6, and the seventh cover window C7 manufactured by the manufacturing method according to an embodiment may have improved impact resistance compared to the first cover window C1 manufactured by the manufacturing method according to a comparative example. That is, a method of manufacturing a cover window may further include the operation of cleaning with an acidic cleaning solution (in operation S45), thereby manufacturing a cover window having improved strength.

Figure 8:
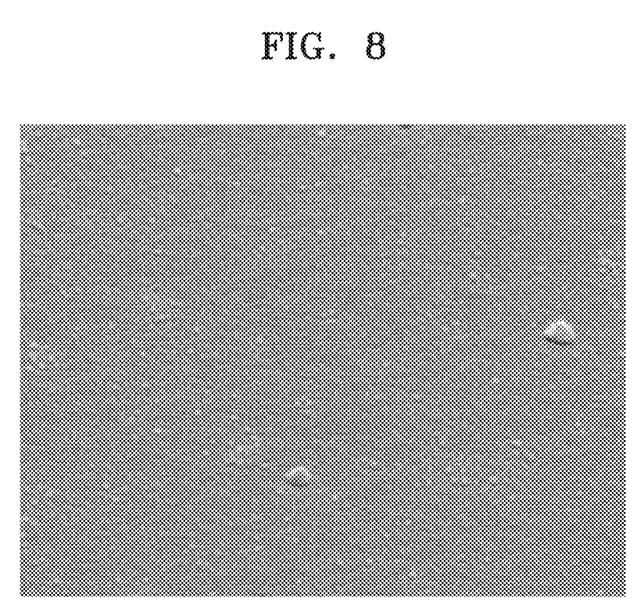
FIGS. 8 and 9 are photomicrographs of surfaces of cover windows manufactured by a manufacturing method according to an embodiment.
Figure 9:
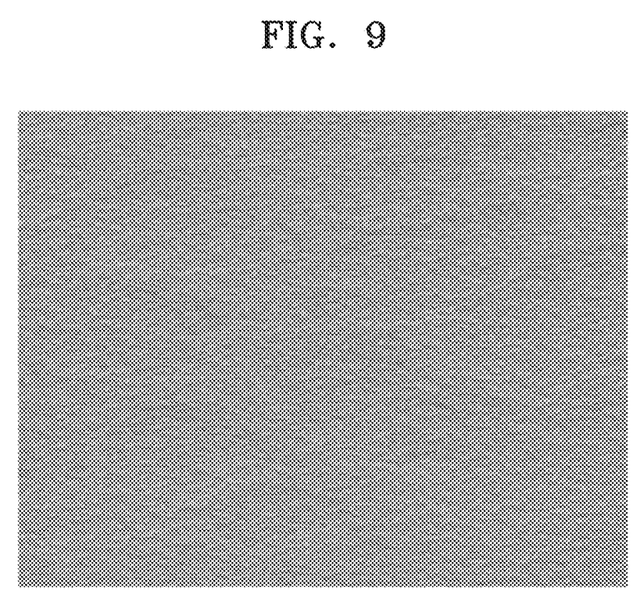

As described above, the strength of a surface of a cover window may be related to roughness of the cover window. FIGS. 8 and 9 are photomicrographs of surfaces of cover windows manufactured by a manufacturing method according to an embodiment. Specifically, FIG. 8 is a photomicrograph of a surface of the fifth cover window C5, and FIG. 9 is a photomicrograph of a surface of the seventh cover window C7.

As shown in FIG. 8, roughness of the surface of the fifth cover window C5 may be less than roughness of the surface of the first cover window C1. This may be because, by the operation of cleaning with an acidic cleaning solution (in operation S45), insoluble fluoride on the surface of the fifth cover window C5 has been removed and micro-defects have been reduced. In addition, as shown in FIG. 9, roughness of the surface of the seventh cover window C7 may be less than roughness of the surface of the fifth cover window C5. This may be because, as described above, the panel glass of the seventh cover window C7 is more cleaned with the acidic cleaning solution than the panel glass of the fifth cover window C5, and thus, insoluble fluoride on the surface of the seventh cover window C7 has been removed more than insoluble fluoride on the surface of the fifth cover window C5 and micro-defects have been further reduced.

Accordingly, as shown in FIG. 7, the first cover window C1 having large roughness may have a low strength, and the seventh cover window C7 having small roughness may have a high strength.

While a method of manufacturing a cover window has been described thus far, the invention is not limited thereto. A method of manufacturing a display apparatus including such a cover window will also fall within the scope of the disclosure. Hereinafter, a method of manufacturing a display apparatus including such a cover window will be described.

Figure 10:
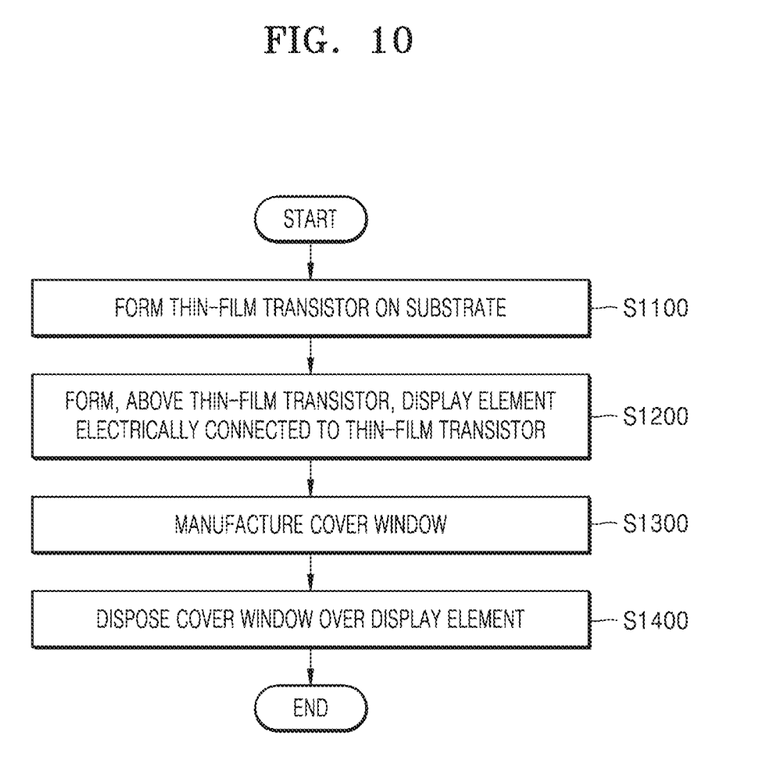
FIG. 10 is a flowchart of a method of manufacturing a display apparatus, according to an embodiment.
Figure 11:
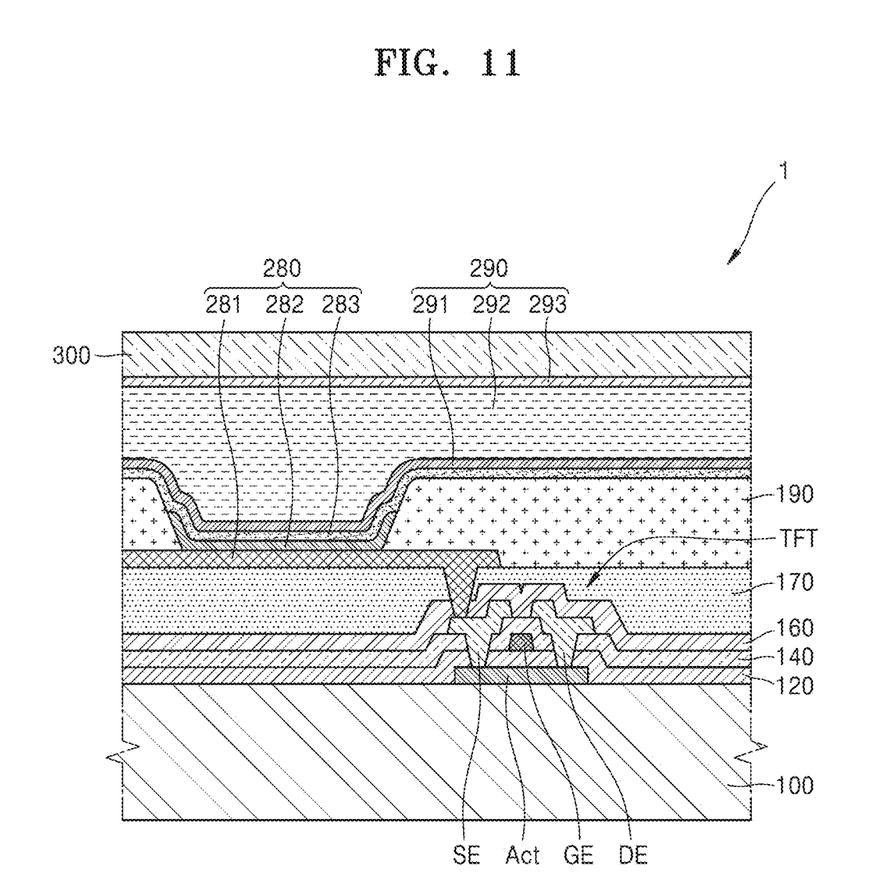
FIG. 11 is a schematic cross-sectional view of a portion of a display apparatus manufactured by a manufacturing method according to an embodiment.

FIG. 10 is a flowchart of a method of manufacturing a display apparatus, according to an embodiment. FIG. 11 is a schematic cross-sectional view of a portion of a display apparatus 1 manufactured by a manufacturing method according to an embodiment. Specifically, the display apparatus 1 manufactured according to an embodiment may include a cover window 300.

As shown in FIG. 10, a method of manufacturing a display apparatus, according to an embodiment may include an operation of forming a thin-film transistor (in operation S1100), an operation of forming a display element (in operation S1200), an operation of manufacturing a cover window (in operation S1300), and an operation of disposing the cover window (in operation S1400).

During the operation of forming a thin-film transistor (in operation S1100), a thin-film transistor TFT may be formed on a substrate 100. The substrate 100 may include various materials having flexible or bendable characteristics. For example, the substrate 100 may include glass, metal, or polymer resin. In addition, the substrate 100 may include polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may be variously modified, for example, to have a multi-layer structure including two layers each including the above polymer resin and a barrier layer between the two layers and including an inorganic material (e.g., silicon oxide, silicon nitride, silicon oxynitride, etc.).

As shown in FIG. 11, the thin-film transistor TFT includes a semiconductor layer Act including amorphous silicon, polycrystalline silicon, an oxide semiconductor material, or an organic semiconductor material, a gate electrode GE, a source electrode SE, and a drain electrode DE. To insulate the semiconductor layer Act and the gate electrode GE from each other, a gate insulating layer 120 including an inorganic material such as silicon oxide, silicon nitride and/or silicon oxynitride may be disposed between the semiconductor layer Act and the gate electrode GE. Further, a first interlayer insulating layer 140 including an inorganic material such as silicon oxide, silicon nitride and/or silicon oxynitride may be disposed on the gate electrode GE, and a second interlayer insulating layer 160 may be disposed to cover the source electrode SE and the drain electrode DE. Such an insulating layer including an inorganic material may be formed through chemical vapor deposition ("CVD") or atomic layer deposition ("ALD"). In addition, a planarization layer 170 may be disposed over the thin-film transistor TFT. The planarization layer 170 may substantially planarize an upper portion of the thin-film transistor TFT. The planarization layer 170 may include an organic material, for example, acryl, benzocyclobutene ("BCB"), or hexamethyldisiloxane ("HMDSO"). Although FIG. 11 shows the planarization layer 170 as a single layer, the planarization layer 170 may have various modifications such as a multilayer.

During the operation of forming a display element (in operation S1200), a display element 280 electrically connected to the thin-film transistor TFT may be formed above the thin-film transistor TFT. The display element 280 may be, for example, an organic light-emitting diode having a pixel electrode 281, an opposite electrode 283, and an intermediate layer 282 disposed therebetween and including an emission layer. When the display element 280 is referred to as being electrically connected to the thin-film transistor TFT, it may be understood as meaning that the pixel electrode 281 of the organic light-emitting diode is electrically connected to the thin-film transistor TFT.

As shown in FIG. 11, the pixel electrode 281 contacts one of the source electrode SE and the drain electrode DE through an opening portion formed in the planarization layer 170, etc. and thus is electrically connected to the thin-film transistor TFT. The pixel electrode 281 includes a light-transmissive conductive layer including light-transmissive conductive oxide such as ITO, $In_2O_3$, or IZO, and a reflective layer including metal such as Al or Ag. For example, the pixel electrode 281 may have a three-layer structure of ITO/Ag/ITO.

A pixel-defining layer 190 may be disposed on the planarization layer 170. The pixel-defining layer 190 includes an opening corresponding to each pixel, that is, an opening exposing at least a central portion of the pixel electrode 281, and thus defines a pixel. In addition, as shown in FIG. 11, the pixel-defining layer 190 increases a distance between an edge of the pixel electrode 281 and the opposite electrode 283 above the pixel electrode 281, thereby preventing occurrence of an arc, etc. at the edge of the pixel electrode 281. The pixel-defining layer 190 may include an organic material, for example, polyimide or HMDSO.

The intermediate layer 282 of the organic light-emitting diode may include a low-molecular weight material or a polymer material. When the intermediate layer 282 includes a low-molecular weight material, the intermediate layer 282 may have a structure in which a hole injection layer ("HIL"), a hole transport layer ("HTL"), an emission layer ("EML"), an electron transport layer ("ETL"), and an electron injection layer ("EIL") are stacked in a single or complex structure, and may be formed by vacuum deposition. When the intermediate layer 282 includes a polymer material, the intermediate layer 282 may have a structure including an HTL and an EML. In this regard, the HTL may include poly(3,4-ethylenedioxythiophene) ("PEDOT"), and the EML may include a polymer material such as a polyphenylene vinylene ("PPV")-based material, a polyfluorene-based material, etc. The intermediate layer 282 may be formed by screen printing, inkjet printing, laser induced thermal imaging ("LITI"), or the like. However, the intermediate layer 282 according to the invention is not limited thereto and may have any of various other structures. In addition, the intermediate layer 282 may include a single layer that covers a plurality of pixel electrodes 281 or may include patterned layers corresponding to the plurality of pixel electrodes 281, respectively.

The opposite electrode 283 may be formed as a single electrode for a plurality of organic light-emitting diodes OLED to correspond to the plurality of pixel electrodes 281. The opposite electrode 283 may include a light-transmissive conductive layer including ITO, $In_2O_3$, or IZO and may include a semi-transmissive layer including metal such as Al or Ag. For example, the opposite electrode 283 may include a semi-transmissive layer including Mg or Ag.

Because the organic light-emitting diode may be easily damaged by external moisture or oxygen, an encapsulation layer 290 may cover and protect the organic light-emitting diode. As shown in FIG. 11, the encapsulation layer 290 may include a first inorganic encapsulation layer 291, an organic encapsulation layer 292, and a second inorganic encapsulation layer 293.

The first inorganic encapsulation layer 291 may cover the opposite electrode 283 and may include silicon oxide, silicon nitride and/or silicon oxynitride. In some cases, other layers such as a capping layer may be disposed between the first inorganic encapsulation layer 291 and the opposite electrode 283. Because the first inorganic encapsulation layer 291 is formed along a structure therebelow, an upper surface of the first inorganic encapsulation layer 291 is not flat as shown in FIG. 11. The organic encapsulation layer 292 may cover the first inorganic encapsulation layer 291, and unlike the first inorganic encapsulation layer 291, an upper surface of the organic encapsulation layer 292 may be substantially flat. The organic encapsulation layer 292 may include one or more materials selected from the group including polyethylene terephthalate, polyethylene naphthalate, polycarbonate, polyimide, polyethylene sulfonate, polyoxymethylene, polyarylate, and HMDSO. The second inorganic encapsulation layer 293 may cover the organic encapsulation layer 292 and may include silicon oxide, silicon nitride and/or silicon oxynitride.

As described above, the encapsulation layer 290 includes the first inorganic encapsulation layer 291, the organic encapsulation layer 292, and the second inorganic encapsulation layer 293, and accordingly, even when cracks occur in the encapsulation layer 290, such a multi-layer structure may prevent the cracks from being connected to each other between the first inorganic encapsulation layer 291 and the organic encapsulation layer 292 or between the organic encapsulation layer 292 and the second inorganic encapsulation layer 293. Thus, formation of a path through which external moisture or oxygen penetrates into the display apparatus 1 may be prevented or reduced.

The operation of manufacturing a cover window (in operation S1300) may include an operation of cutting mother glass into panel glass, an operation of chamfering the panel glass, an operation of etching the panel glass with a first etching solution, an operation of etching the panel glass with a second etching solution, an operation of cleaning the panel glass with an acidic cleaning solution, and an operation of cleaning the panel glass with a basic cleaning solution.

The above description of the operation of cutting mother glass into panel glass (in operation S10), the operation of chamfering the panel glass (in operation S20), the operation of etching the panel glass with a first etching solution (in operation S30), the operation of etching the panel glass with a second etching solution (in operation S40), the operation of cleaning the panel glass with an acidic cleaning solution (in operation S45), and the operation of cleaning the panel glass with a basic cleaning solution (in operation S50) may also be applied to an operation of cutting mother glass into panel glass, an operation of chamfering the panel glass, an operation of etching the panel glass with a first etching solution, an operation of etching the panel glass with a second etching solution, an operation of cleaning the panel glass with an acidic cleaning solution, and an operation of cleaning the panel glass with a basic cleaning solution, which are included in the operation of manufacturing a cover window (in operation S1300), according to the present embodiment, and thus, a repeated description thereof is omitted below.

During the operation of disposing the cover window (in operation S1400), the cover window 300 may be disposed over the substrate 100. Specifically, the display apparatus 1 may include a display panel and the cover window 300, and the display panel may include the thin-film transistor TFT and the display element 280. The cover window 300 may be disposed on the display panel, and the cover window 300 may be attached to the display panel. For example, the cover window 300 may be attached to the display panel by pressure-sensitive adhesive ("PSA"). The cover window 300 may be disposed on the display panel to protect the display panel from external shock.

According to one or more of the above embodiments, a method of manufacturing a cover window having improved strength and a method of manufacturing a display apparatus including the cover window may be provided. However, one or more embodiments are not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a cover window, the method comprising:
cutting mother glass into panel glass;
chamfering the panel glass;
etching an entire surface of the panel glass with a first etching solution comprising a fluorine-based compound;
etching the entire surface of the panel glass with a second etching solution different from the first etching solution; and
cleaning the panel glass with a basic cleaning solution.

2. The method of claim 1, wherein the first etching solution is an acidic solution, and the second etching solution is a basic solution.

3. The method of claim 2, wherein the first etching solution comprises at least one of hydrofluoric acid (HF), ammonium fluoride ($NH_4F$), and ammonium bifluoride ($NH_4HF_2$).

4. The method of claim 2, wherein the second etching solution comprises at least one of sodium hydroxide (NaOH) and potassium hydroxide (KOH).

5. The method of claim 1, wherein the etching with the second etching solution is performed after the etching with the first etching solution.

6. The method of claim 1, wherein the etching with the first etching solution comprises etching the entire surface of the panel glass by immersing the panel glass in the first etching solution, and the etching with the second etching solution comprises etching the entire surface of the panel glass by immersing the panel glass in the second etching solution.

7. The method of claim 1, wherein a ratio between a reduced size of a thickness of the panel glass by the etching with the first etching solution and a reduced size of a thickness of the panel glass by the etching with the second etching solution is 4:1 to 9:1.

8. The method of claim 1, further comprising:
cleaning the panel glass with an acidic cleaning solution,
wherein the cleaning with the acidic cleaning solution is performed between the etching with the second etching solution and the cleaning with the basic cleaning solution.

9. The method of claim 8, wherein the acidic cleaning solution has a pH of about 2 or less and comprises no fluorine.

10. The method of claim 8, wherein the basic cleaning solution comprises at least one of sodium hydroxide (NaOH) and potassium hydroxide (KOH).

11. The method of claim 10, wherein the second etching solution comprises at least one of sodium hydroxide (NaOH) and potassium hydroxide (KOH),
wherein a temperature of the basic cleaning solution in the cleaning with the basic cleaning solution is lower than a temperature of the second etching solution in the etching with the second etching solution.

12. A method of manufacturing a display apparatus, the method comprising:
forming a thin-film transistor on a substrate;
forming a display element above the thin-film transistor, wherein the display element is electrically connected to the thin-film transistor;
manufacturing a cover window; and
disposing the cover window over the display element,
wherein the manufacturing of the cover window comprises:
cutting mother glass into panel glass;
chamfering the panel glass;
etching an entire surface of the panel glass with a first etching solution comprising a fluorine-based compound;
etching the entire surface of the panel glass with a second etching solution different from the first etching solution; and
cleaning the panel glass with a basic cleaning solution.

13. The method of claim 12, wherein the first etching solution is an acidic solution, and the second etching solution is a basic solution.

14. The method of claim 13, wherein the first etching solution comprises at least one of hydrofluoric acid (HF), ammonium fluoride ($NH_4F$), and ammonium bifluoride ($NH_4HF_2$).

15. The method of claim 13, wherein the second etching solution comprises at least one of sodium hydroxide (NaOH) and potassium hydroxide (KOH).

16. The method of claim 12, wherein the etching with the second etching solution is performed after the etching with the first etching solution.

17. The method of claim 12, wherein the etching with the first etching solution comprises etching the entire surface of the panel glass by immersing the panel glass in the first etching solution, and the etching with the second etching solution comprises etching the entire surface of the panel glass by immersing the panel glass in the second etching solution.

18. The method of claim 12, wherein a ratio between a reduced size of a thickness of the panel glass by the etching with the first etching solution and a reduced size of a thickness of the panel glass by the etching with the second etching solution is 4:1 to 9:1.

19. The method of claim 12, wherein the manufacturing of the cover window further comprises:
cleaning the panel glass with an acidic cleaning solution,
wherein the cleaning with the acidic cleaning solution is performed between the etching with the second etching solution and the cleaning with the basic cleaning solution.

20. The method of claim 19, wherein the acidic cleaning solution has a pH of about 2 or less and comprises no fluorine.

21. The method of claim 19, wherein the basic cleaning solution comprises at least one of sodium hydroxide (NaOH) and potassium hydroxide (KOH).

22. The method of claim 21, wherein the second etching solution comprises at least one of sodium hydroxide (NaOH) and potassium hydroxide (KOH),
wherein a temperature of the basic cleaning solution in the cleaning with the basic cleaning solution is lower than a temperature of the second etching solution in the etching with the second etching solution.

* * * * *